(12) United States Patent
Liou et al.

(10) Patent No.: US 9,224,677 B1
(45) Date of Patent: Dec. 29, 2015

(54) SEMICONDUCTOR PACKAGE

(71) Applicant: Marvell International Ltd., Hamilton (BM)

(72) Inventors: Shiann-Ming Liou, Campbell, CA (US); Chenglin Liu, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 98 days.

(21) Appl. No.: 13/937,051

(22) Filed: Jul. 8, 2013

Related U.S. Application Data

(60) Continuation of application No. 13/234,390, filed on Sep. 16, 2011, now Pat. No. 8,482,112, which is a division of application No. 11/388,343, filed on Mar. 23, 2006, now Pat. No. 8,022,522.

(60) Provisional application No. 60/667,342, filed on Apr. 1, 2005, provisional application No. 60/681,745, filed on May 17, 2005, provisional application No. 60/687,979, filed on Jun. 7, 2005.

(51) Int. Cl.
*H01L 23/02* (2006.01)
*H01L 23/495* (2006.01)
*H01L 21/50* (2006.01)

(52) U.S. Cl.
CPC .......... *H01L 23/49575* (2013.01); *H01L 21/50* (2013.01)

(58) Field of Classification Search
CPC ............... H01L 2224/73265; H01L 23/49513; H01L 23/49537; H01L 23/28
USPC .................. 257/676, 686, 723, 777; 438/107
See application file for complete search history.

(56) References Cited

U.S. PATENT DOCUMENTS

| | | | |
|---|---|---|---|
| 4,875,618 A | 10/1989 | Hasegawa et al. | |
| 4,891,687 A | 1/1990 | Mallik et al. | |
| 5,012,323 A | 4/1991 | Farnworth | |
| 5,313,095 A | 5/1994 | Tagawa et al. | |
| 5,328,079 A | 7/1994 | Mathew et al. | |
| 5,422,435 A * | 6/1995 | Takiar et al. | 174/521 |
| 5,767,573 A * | 6/1998 | Noda et al. | 257/675 |
| 6,079,610 A | 6/2000 | Maeda et al. | |
| 6,204,553 B1 | 3/2001 | Liu et al. | |
| 6,545,347 B2 | 4/2003 | McClellan | |
| 6,570,249 B1 | 5/2003 | Liao et al. | |
| 6,946,324 B1 | 9/2005 | McLellan et al. | |
| 8,482,112 B1 * | 7/2013 | Liou et al. | 257/686 |

* cited by examiner

*Primary Examiner* — Theresa T Doan

(57) ABSTRACT

Semiconductor packages and associated techniques are described. A described semiconductor package includes a lead frame; a first wire bond; a second wire bond; a first voltage source to provide a first voltage; a second voltage source to provide a second voltage; a first die pad coupled with the first voltage source via the first wire bond; a second die pad coupled with the second voltage source via the second wire bond; a first die disposed on the first die pad; a second die disposed on the second die pad; and an encapsulant. The first die pad and the second die pad can be electrically isolated from each other such that the first die pad is maintainable at a first potential associated with the first voltage source and the second die pad is maintainable at a second potential associated with the second voltage source.

14 Claims, 13 Drawing Sheets

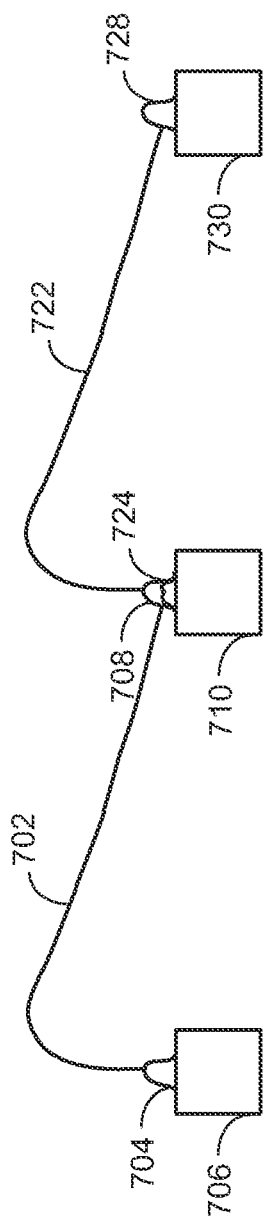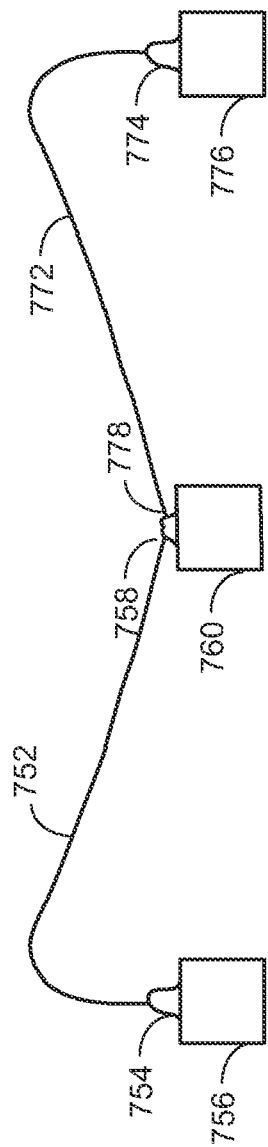
FIG. 7A
FIG. 7B

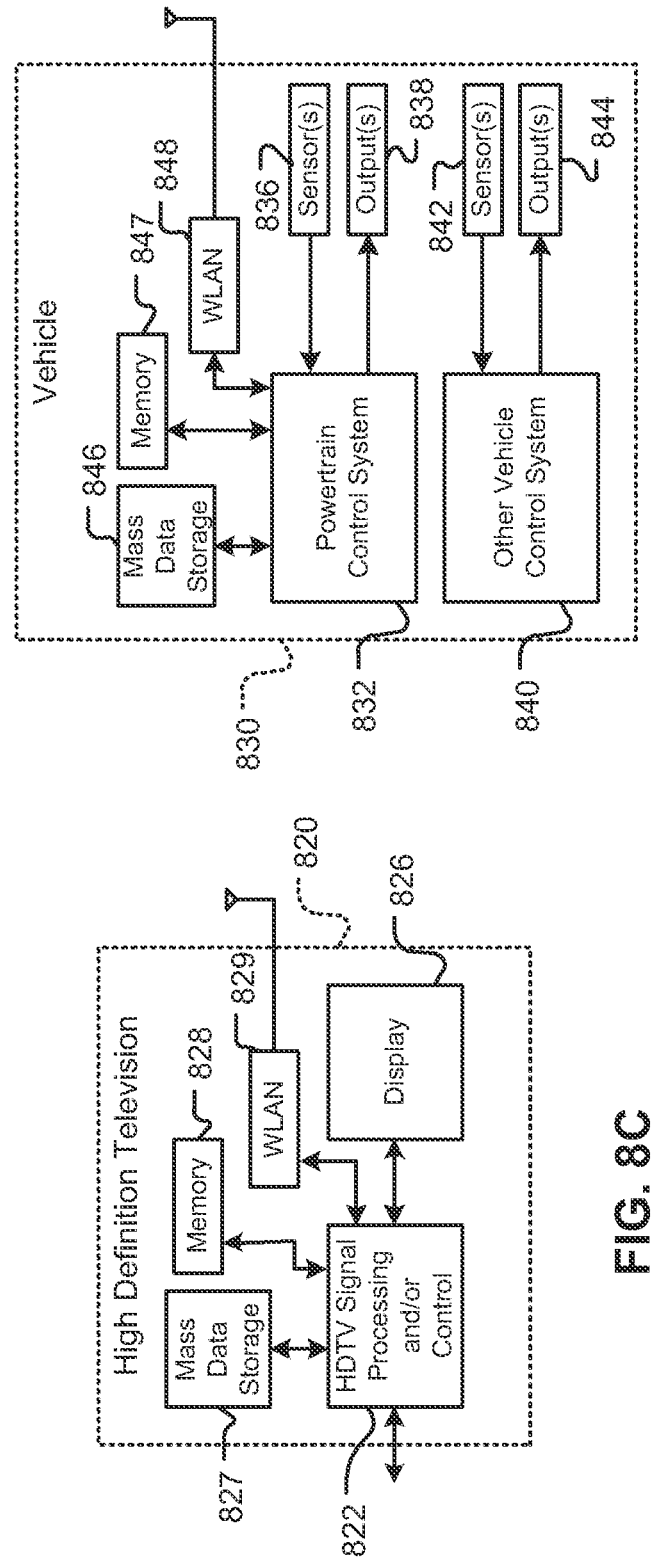

SEMICONDUCTOR PACKAGE

CROSS-REFERENCE TO RELATED APPLICATIONS

The present application is a continuation application of U.S. patent application Ser. No. 13/234,390, filed on Sep. 16, 2011 (now U.S. Pat. No. 8,482,112), which is a divisional application of U.S. patent application Ser. No. 11/388,343, filed on Mar. 23, 2006 (now U.S. Pat. No. 8,022,522), which claims priority to U.S. Provisional Patent Application No. 60/667,342, filed on Apr. 1, 2005, U.S. Provisional Patent Application No. 60/681,745, filed on May 17, 2005 and U.S. Provisional Patent Application No. 60/687,979, filed on Jun. 7, 2005, each of which is incorporated herein by reference in its entirety.

TECHNICAL FIELD

This invention relates to semiconductor packaging.

BACKGROUND

Miniaturization of microelectronic circuits continues to be a focal point of today's semiconductor processing technologies. Microelectronic circuits, such as semiconductor dies and semiconductor chips, have been reduced both in area and thickness to conserve space occupied on a circuit board or substrate carrying structures. As semiconductor circuits are reduced in size, packaging constraints may limit the ultimate footprint of the packaged device. What is desirable are packaging solutions that continue to evolve to support the advances made in the processing sciences.

SUMMARY

In one aspect a semiconductor package is provided that includes a lead frame including a first die pad and a second die pad where each die pad is supported by one or more supports and isolated from another. The semiconductor package includes at least first and second dice, a first die being disposed on the first die pad and a second die being disposed on the second die pad. The package further includes wire bonds in communication with the first and second dice and an encapsulant adapted to encapsulate the die pads, the dice, the lead frame and the wire bonds.

Aspects of the invention can include one or more of the following features. Bottom surfaces of the first and second die pads can lie in substantially a same plane. Bottom surfaces of the first die pad and the second die pad can be exposed to an exterior of the semiconductor package. A bottom surface of at least one of the first die pad and the second die pad can be unexposed to an exterior of the semiconductor package. A bottom surface of the first die pad and the second die pad can be substantially planar. A bottom surface of the first die pad can lie on a first plane and a bottom surface of the second die pad can lie in a second plane different from the first. The semiconductor package can include a third die, where the third die is stacked on the first die. The first die can extend laterally beyond an edge of the third die. The semiconductor package can include a spacer located between the first and third die.

The semiconductor package can include at least one shared ring disposed between the first die pad and the second die pad, where the two dice are interconnected at least one point using the shared ring. The first die pad and second die pad can be electrically and or thermally isolated. The first die pad can be coupled to a first voltage source and the second die pad can be coupled to a second voltage source different than the first voltage source. The first voltage source can be a ground.

In another aspect a semiconductor package is provided that includes a lead frame including a first die pad and a second die pad where each die pad is supported by one or more supports and isolated from another. The package includes at least first and second dice, a first die being disposed on the first die pad and a second die being disposed on the second die pad. The package includes a bonding ring coupled by bonding wires to one or more bond pads associated with the first and second dice. The package also includes an encapsulant adapted to encapsulate the die pads, the dice, the lead frame, bonding ring and the wire bonds.

Aspects of the invention can include one or more of the following features. At least one surface of the bonding ring can be exposed and not encapsulated by the encapsulant.

In another aspect, a semiconductor package is provided that includes a substrate, at least first and second dice disposed in the substrate, and a bonding ring coupled by bonding wires to one or more bond pads associated with the first and second dice.

Aspects of the invention can include one or more of the following features. The bonding ring can be disposed in the substrate between the first and second dice. The first bond ring can encircle the first die. The semiconductor package can include a second bond ring configured to encircle the first bond ring.

In another aspect, a semiconductor package is provided that includes a lead frame including a die pad; at least one die, a first of which is disposed on the die pad; wire bonds connecting the die to external or internal elements of the semiconductor package; and an encapsulant adapted to encapsulate the die pad, the die, the lead frame and the wire bonds.

Aspects of the invention can include on or more of the following features. The bond pad includes a first bond end for the first wire bond and a second bond end for the second wire bond. The bond pad can include a second bond end of the first bond wire and a second bond end of the second bond wire.

In another aspect a method for bonding a pair of wire bonds in a semiconductor package includes depositing a ball to a common location of a semiconductor package; bonding a first end of a wire bond to a first location of a semiconductor package; bonding a second end of the first wire bond to the ball; bonding a first end of a second wire bond to the ball; and bonding a second end of the second wire bond to a second location of the semiconductor package.

Aspects of the invention can include on or more of the following features. The common location can be a bond pad of a die.

In another aspect a method is provided for bonding a pair of wire bonds to a bonding pad of a semiconductor package. The method includes comprising depositing a ball to a common location of a semiconductor package; bonding a first end of a wire bond to a first location of a semiconductor package; bonding a second end of the first wire bond to the ball; bonding a first end of a second wire bond to a second location of the semiconductor package; an bonding a second end associated with the second wire bond to the ball.

Aspects of the invention can include one or more of the following features. The common location can be a bond pad of a die.

The described systems and techniques can be implemented in electronic circuitry, computer hardware, firmware, software, or in combinations of them, such as the structural means disclosed in this specification and structural equivalents thereof. This can include a program operable to cause one or more machines (e.g., a signal processing device including a programmable processor) to perform operations described. Thus, program implementations can be realized from a disclosed method, system, or apparatus, and apparatus implementations can be realized from a disclosed system, program, or method. Similarly, method implementations can be realized from a disclosed system, program, or apparatus, and system implementations can be realized from a disclosed method, program, or apparatus.

For example, the disclosed embodiment(s) below can be implemented in various systems and apparatus, including, but not limited to, a special purpose machine (e.g., a wireless access point, a remote environment monitor, a router, a switch, a computer system component, a medium access unit), a mobile data processing machine (e.g., a wireless client, a cellular telephone, a personal digital assistant (PDA), a mobile computer, a digital camera), a general purpose data processing machine (e.g., a minicomputer, a server, a mainframe, a supercomputer), or combinations of these.

One or more of the following advantages may be realized by embodiments of the invention. A packaging solution is proposed that allows for multiple die to be package together while allowing for the isolation of the respective individual dice. The isolation can be electrical or thermal. The packaging solution can be used in a lead-frame package that includes at least two die pads, each isolated from the other. The packaging solution can also include one or more shared rings creating one or more common locations for bonding between multiple locations. A shared ring can be used in a substrate based package.

Bonding solutions are disclosed that can be realized to allow for the sharing of a single bonding pad by two bonds. A first end of a bond wire can be formed at a location in a semiconductor package. A second end of the bond wire can be formed at a bond pad associated with a die in the semiconductor device. A first or second end of a different bond wire can be collocated on the same bond pad.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 7A-B show structures including two examples of two wire bond configurations for one conventional die pad.

FIGS. 8A-8G show various exemplary implementations that can include the described systems and techniques.

Like reference symbols in the various drawings indicate like elements.

DETAILED DESCRIPTION

In the following description, various implementations of the invention will be described. However, it will be apparent to those skilled in the art that the implementations may be practiced with only some or all aspects of the present invention. Techniques and requirements that are only specific to certain implementations should not be imported into other implementations. For purposes of explanation, specific numbers, materials and configurations are set forth in order to provide a thorough understanding of the implementations. These are, of course, merely examples and are not intended to limit the invention from that described in the claims.

The systems and techniques described herein can be implemented in one or more devices, such as one or more integrated circuit (IC) devices (e.g., a wireless communication device, an electronic data storage device, a channel medium access access/control device). Exemplary devices are described in greater detail below in association with FIGS. 8A-8G.

Figure 1:
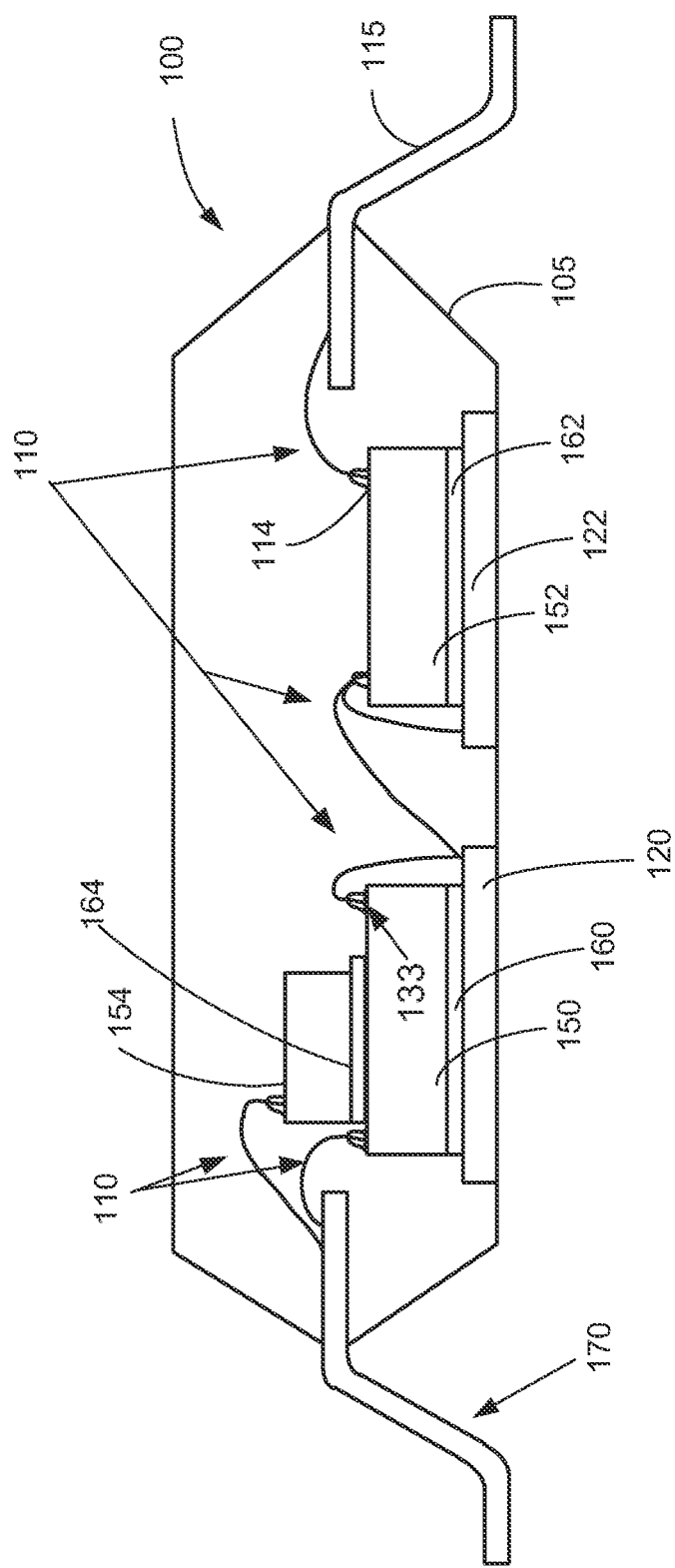
FIG. 1 shows a cross sectional view of a split die pad structure including two exposed die pads.
Figure 2:
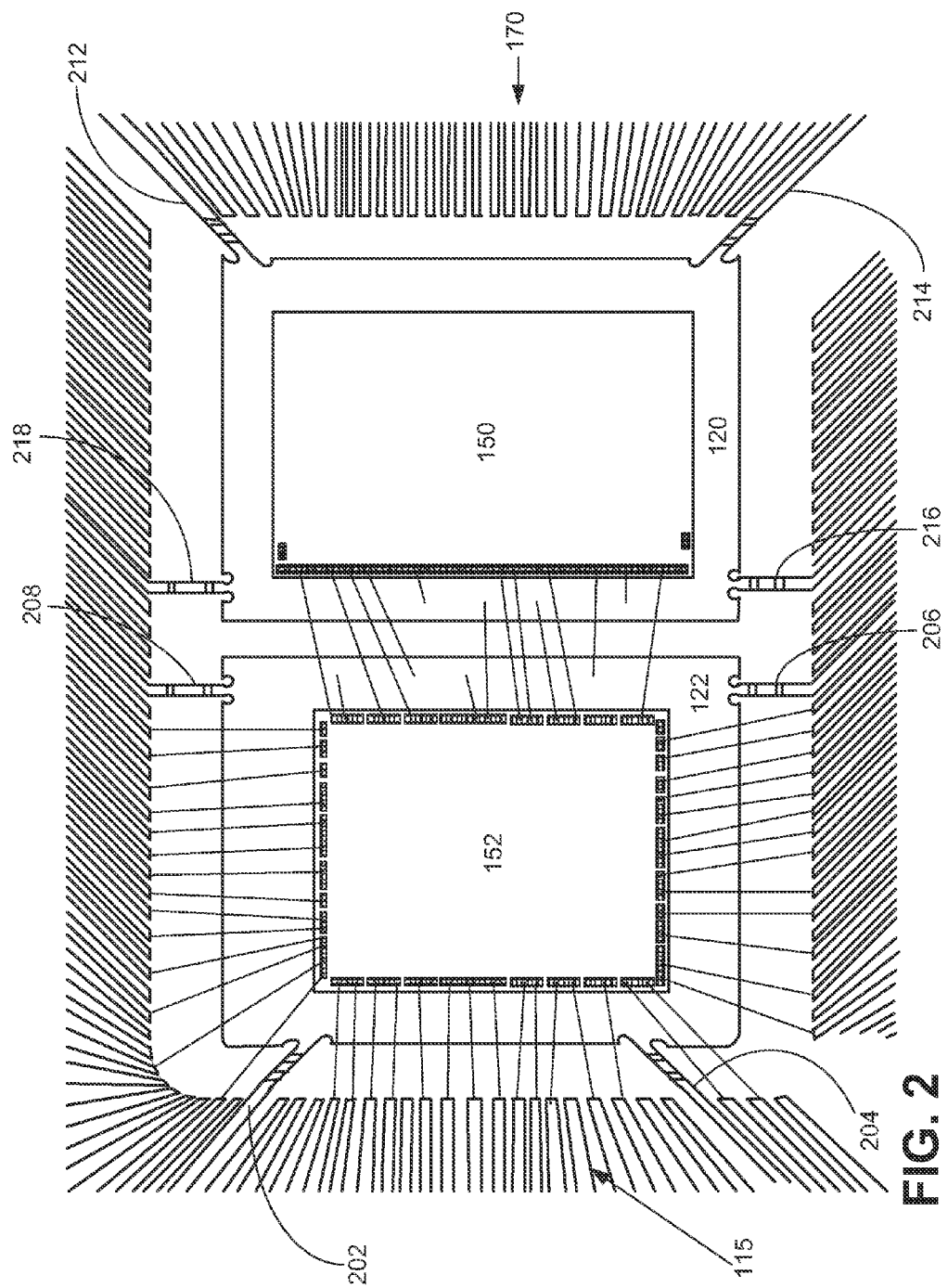
FIG. 2 shows a top view of the split die pad structure of FIG. 1.
Figure 3:
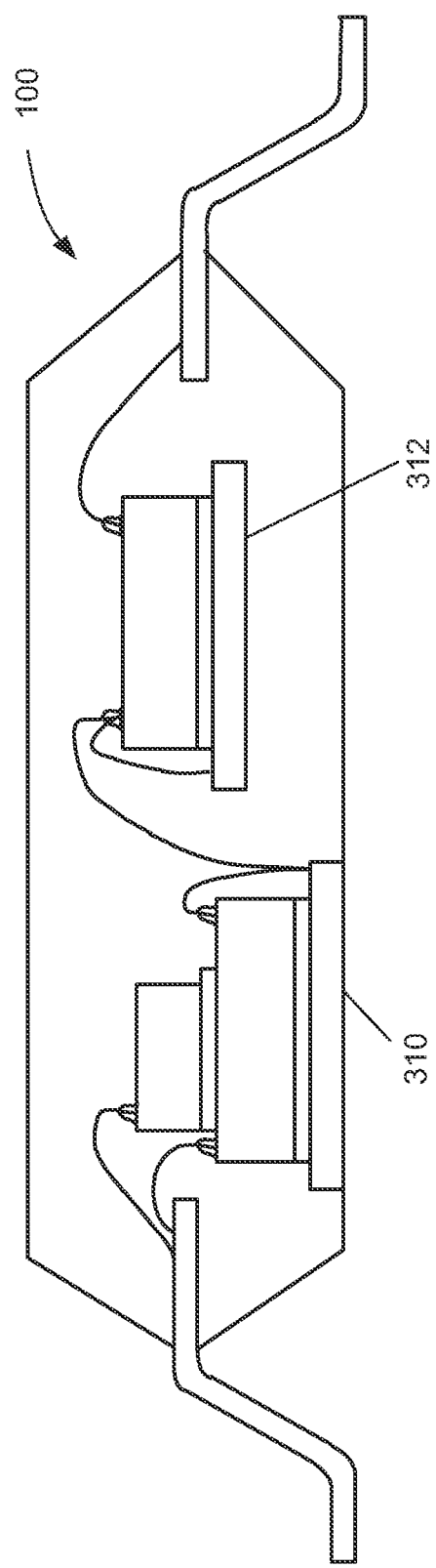
FIG. 3 shows a cross sectional view of a split die pad structure including one exposed and one encapsulated die pad.

FIG. 1 illustrates a cross section of an exemplary semiconductor package 100 that includes a split die pad structure. The package can be a lead frame package (e.g., LQFP, TQFP, QFN or TSOP) or a substrate based package (E.g., PBGA, TFBGA, or LGA). FIGS. 1-5 show an example of a lead frame based package design. Semiconductor package 100 includes a shaped body portion (e.g., hexagon) 105 that encapsulates wire bonds 110, split die pads 120, 122, dice 150, 152, 154, die attach materials 160, 162 and 164, and lead frame 170. Though the example shown includes three dice, other numbers and configurations of die are possible. Further, though stacked dice are shown, none of the dice need be so configured. In a simple embodiment, only two die are included in the semiconductor package 100, both mounted to separate (i.e., split) die pads. Alternatively, designs with more than two die can be provided with two or more dice having separate die pads as required. For example, a three dice configuration is possible with all three mounted in a same plane and on isolated die pads. Alternatively, in a three dice configuration, two of the dice can be mounted to a single die pad either by stacking as shown or otherwise sharing the die pad.

Shaped body portion 105 can be shaped to encapsulate the required components. A hexagonal shape is shown in association with FIGS. 1-5B, though other shapes are possible. The components can be encapsulated using, for example, molding compound. The molding compound can encapsulate the die, die attach materials, the wires, the top surface of the die attach pad or the entire die attach pads and bonding fingers as will discussed in greater detail below.

Wire bonds are used to provide electrical connections between the die and the external world (e.g., connection between bond pads on the die and to frame fingers) or between devices/elements of the semiconductor package (e.g., bond pad to bond pad, or bond pad to die pad, or bond pad to bonding ring, etc.). In FIG. 1, several bonding wires 110 are shown. The wire used in wirebonding can be, for example, gold, aluminum or copper. One wirebonding method is ball bonding or commonly referred to as gold ball bonding (i.e., when gold wire bonds are formed). In gold ball bonding, a gold ball is formed (e.g., the free-air ball) which is then attached to a respective location (e.g., a bond pad of the die) using appropriate amounts of pressure, heat, ultrasonic forces and the like. Thereafter, the wire is run to a corresponding second location (e.g., a lead frame finger) forming a gradual arc or loop between first and second locations (e.g., the bond pad and the lead frame finger). The wire is attached at the second location (e.g., using pressure and ultrasonic forces) to form a second bond referred to sometimes as the stitch bond, wedge bond or fishtail bond. A wirebonding machine can be used to form the bonds as well as break the wire in preparation for the next wirebond cycle. Wire bonding can be die to die, die to bonding finger, die to die pad, die to bonding ring (i.e., as will be discussed in greater detail below in association with FIG. 5), die pad to bonding finger and intra die. Bonding rings are discussed in greater detail below in association with FIGS. 5A-5B and 6. Wire bonding is discussed in greater detail below in association with FIGS. 7A-C.

Split die pads 120, 122 allow for the isolation (e.g., thermal, electrical or otherwise) of the respective die. Lead frame 170 includes plural supports (shown in FIG. 2) for supporting the respective split die pads 120, 122. Further, lead frame 170 includes lead frame fingers 115 which provide external pin connections for the dice 150, 152, 154. Referring to the top view of the lead frame 170 shown in FIG. 2, associated with the die pad 120 are a first set of support structures including corner supports 202, 204 and side supports 206, 208 for supporting die 150. Associated with the die pad 122 are a second set of support structures including corner supports 212, 214 and side supports 216, 218 for supporting die 152. Corner and side supports 202-218 can be formed as tie bars. Alternatively, one or more pins of the semiconductor package can be extended to provide support for one or more die pads. Recognizing that the number of pins available on a semiconductor package may be limited, tie bars can be used as alternative support elements. The supports can be formed by etching or stamping processes and allow for the support of the die pads at multiple heights in the semiconductor packaging. For example, one die pad support set could be created by a first stamp process (i.e., one stamp depth) that supports the associated die at a first height in the semiconductor package (i.e., at a height that allows the die pad to be completely encapsulated). A second stamping process (i.e., two stamp depth) can be used to create a second set of supports to be associated with a second die pad that allows an associated second die to be supported at a second height in the semiconductor package (i.e., at a height that allows the die pad to be exposed).

Split die pads 120, 122 can be formed by conventional means. Split die pads 120, 122 can as well be exposed or not. By exposed, we refer to a configuration as shown in FIG. 1, where the die pads are not encapsulated in the body portion 105, leaving a bottom portion of the die pad exposed, for example, so as to be held in thermal contact with a heat sink, held in electrical contact with a voltage source or otherwise. The split die pads 120, 122 provide isolation for multiple purposes. For example, the split die pad configuration of split die pads 120, 122 allows for thermal separation between dice 150, 152. Alternatively, or additionally, split die pads 120, 122 can provide electrical isolation between the dice 150, 152. For example each of die pads 120, 122 can be maintained at a same (e.g. both maintained at ground potential) or different potential (e.g., one maintained at ground and one maintained at 1.8v).

Figure 4:
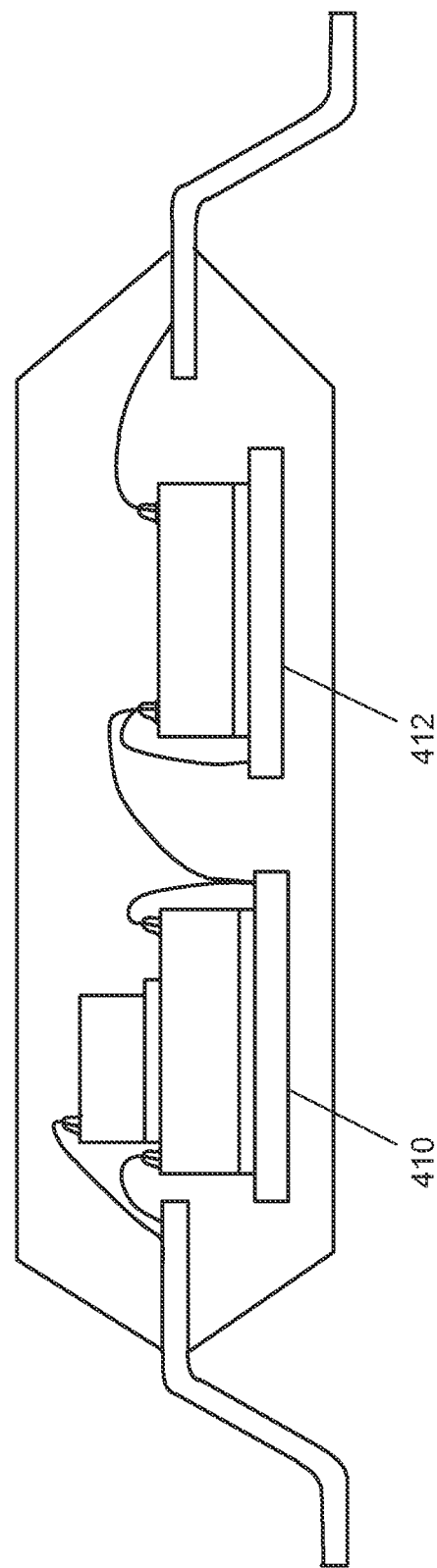
FIG. 4 shows a cross sectional view of a split die pad structure including two encapsulated die pads.

Although, the configuration shown includes split die pads 120, 122 lying in a same plane, other configurations are possible including non co-planar configurations. For example, in the configuration shown in FIG. 3, a split die pad configuration is shown that includes split die pads 310, 312 where one is exposed and one is encapsulated, each being located in respective separate planes. FIG. 4 shows a split die pad configuration that includes two dice being supported by two die pads, 410, 412 respectively, both of which are encapsulated (i.e., not exposed).

Referring again to FIG. 1, die (e.g. dice 150, 152) are mounted to split die pads 120, 122 respectively using die attach materials 160, 162. Specifically, after die pads 120, 122 have been formed, die attach materials 160, 162 are respectively applied to a connecting surface (i.e., top surface) of the die pads 120, 122. Thereafter, dice 150, 152 are located on the respective die attach materials 160, 162 so as to provide a mechanical bonding between an interface of the die pad 120, 122 and that of the die 150, 152.

The die attach materials 160, 162 (and 164 discussed below) may be in the form of an adhesive paste, film or otherwise which can be cured (as required) and dispensed using conventional die attach equipment and procedures. Other conventional techniques for die attachment can be used including eutectic processes using an eutectic alloy as an attach material. The die attach materials 160, 162 (and 164) also may be either electrically conductive or non-conductive.

In the implementation shown, one of the die is mounted in a stacked structure. For example, die 150 can have die 154 stacked thereon using die attach materials 164. More specifically, and as illustrated, upon attaching die 150 using the die attach material 160, another layer of die attach material 164 is supplied onto a top surface of the die 150 so as to allow for the stacking of another die 154 onto the die 150. Additional die may be stacked using the stacked technique described above (e.g., three stacked dice). In the implementation shown, two stacked dice are provided. Alternatively, more die can be stacked, limited only by an overall size of the semiconductor package 100 as designed for a particular application.

In this implementation, the die 154 has a bottom surface that is positioned above the plane formed by the upper surfaces of the dice 150 and 152, and has a lateral length shorter than that of the die 154. In one implementation, the lateral length of the die 154 may not extend laterally over or partially overlap the edges of the die 150, die pad 120 or lead frame 170 (e.g., so as to allow for the connection of various wires to the bonding pads of the die 150). Depending on the actual design application, a die having a pair of opposing edges extending laterally beyond the edges of the die 150 or die pad 160 may be employed. In this configuration, a spacer (not shown) can be used to allow for access to bonding pads associated with the lower (e.g., die 150) die.

The dice 150, 152, 154 may be thermally insulated from one another by the thermal dissipation properties of the die attach materials. Although dice having rectangular configuration (cross section or shape) have been illustrated, dice having other polygonal configurations including substantially square may be implemented without departing from the spirit and scope of the present invention. Each die may individually include various types of memories, processors and integrated circuitry. Further, each die can include a plurality of bond pads (e.g., bond pads that allow for bonds, e.g. bond 114, to be formed) that provide external terminals along, for example, the marginal portion of the die.

Bonding Rings

Figure 5A:
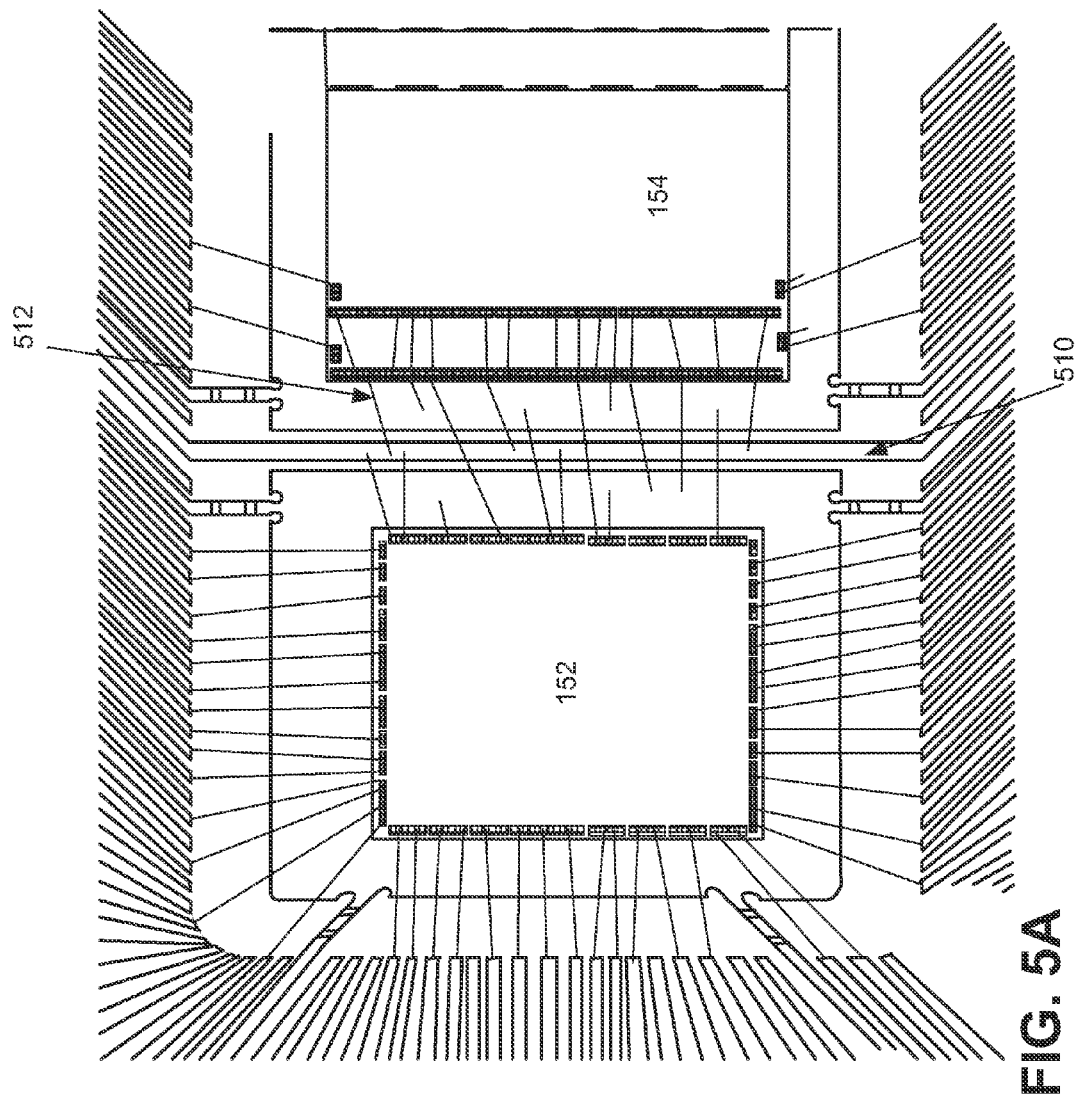
FIG. 5A-5B show a top and cross sectional views respectively of a split die pad structure including one shared ring.
Figure 5B:
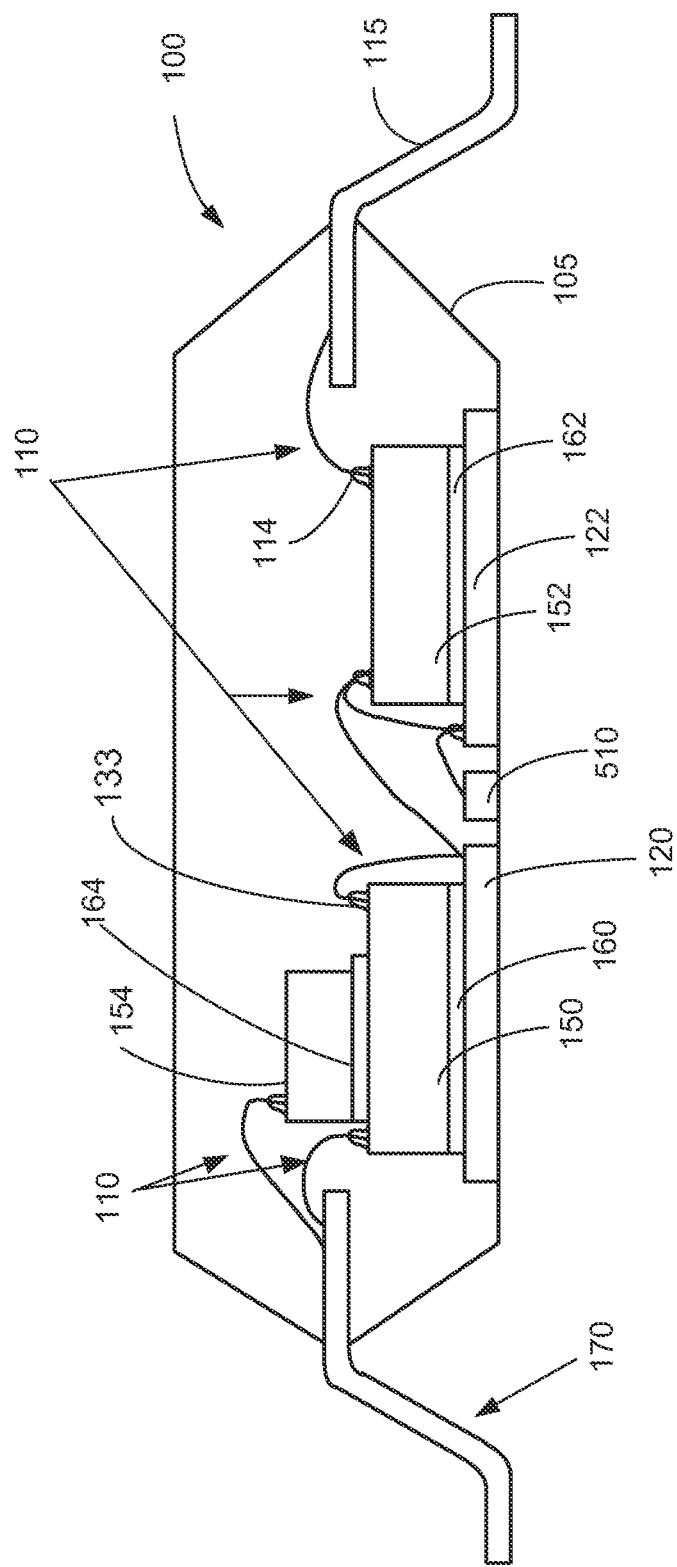

Lead frame 170 can include, in addition to the die pads 120, 122, supports 202-218 and frame fingers 115, one or more bonding rings. Bonding rings can be formed, for example as part of the lead frame formation processes. FIG. 5A shows one example of a split die pad structure that includes one shared bonding ring 510. More specifically, three dice 150, 152 and 154 are shown including two stacked dice 150, 154. Die 154 is stacked on die 150 and includes an extent that does not completely overlap die 150 so as to allow for connections to bonding pads on die 150. Bonding ring 510 can be shared by one or more of the dice. That is, bonding ring 510 can have wire bonds 512 that are coupled to one or more different dice in the configuration. The bonding ring 510 can be coupled to external bonding fingers to allow for the coupling of the bonding ring 510 to a common source (e.g., voltage or current source, ground plane, etc.). FIG. 5B shows a cross sectional view of the semiconductor package shown in FIG. 5A including bonding ring 510. In the configuration shown in FIG. 5B, the bonding ring is exposed. That is, the bonding ring 510 is not covered on all sides by encapsulant (i.e., a bottom surface of the bonding ring 510 is exposed. In some implementations, the bonding ring can be located so as to not be exposed. In a non-exposed configuration, the bonding ring is completely encapsulated on all sides by, for example, molding compound.

Figure 6:
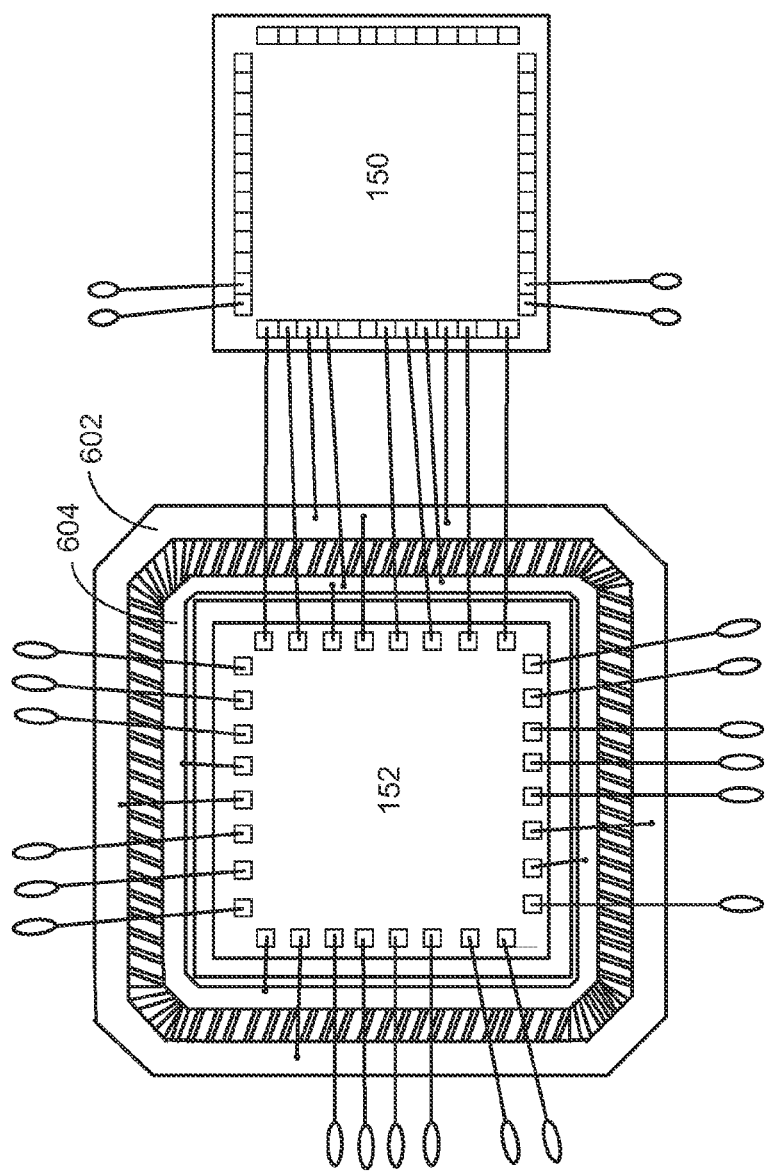
FIG. 6 shows a top view of a split die pad structure including shared rings in a substrate based package.

FIG. 6 shows a substrate based semiconductor package configuration that includes a plurality of bonding rings. In the implementation shown, two bonding rings are formed in the substrate that enclose die 152, including an outer ring 602 and an inner ring 604.

Wire Bonding

Once the dice 150, 152 and 154 are properly positioned and supported in the lead frame 170, these components are electrically interconnected by wire bonds 110. Wire bonds 110 may be placed in accordance with a predetermined wiring pattern. Wire bonds 110 can be used to electrically couple a die to another die, a die to a bonding finger, a die to a die pad, a die to a bonding ring, or a die pad to a bonding finger so that electrical signals can be transmitted therebetween. Conventional wire bonding equipment can be utilized to form the wire bonds 110.

In one implementation, a process for bonding respective ends of a wire bond to their associated components (e.g., die pad, bonding pad, bonding ring, etc.) may involve a formation of a free-air ball along with the respective bonding steps described above. The loop height may be shortened relative to the thickness of a die so as not to protrude from the semiconductor package 100. For example, a wire bond can be made substantially coplanar with the upper surface of the dice and curved downward (e.g., at a 900 angle) to reduce the loop height created by the wire bond or susceptibility to potential circuit shorting. Materials for wire bonds may be selected from copper, gold, or aluminum to ensure strong bondage and high production yields. Other suitable materials also may be employed. Specific wire properties such as hardness, thickness, elongation and tensile strength may be selected based on the design application and/or bonding process and parameters employed for the assembly.

In some implementations, multiple wire bonds may be electrically connected to a same bond pad. For example, as shown in FIG. 1, multiple bond wires may have ends coupled to a same bond pad 133.

Figure 7C:
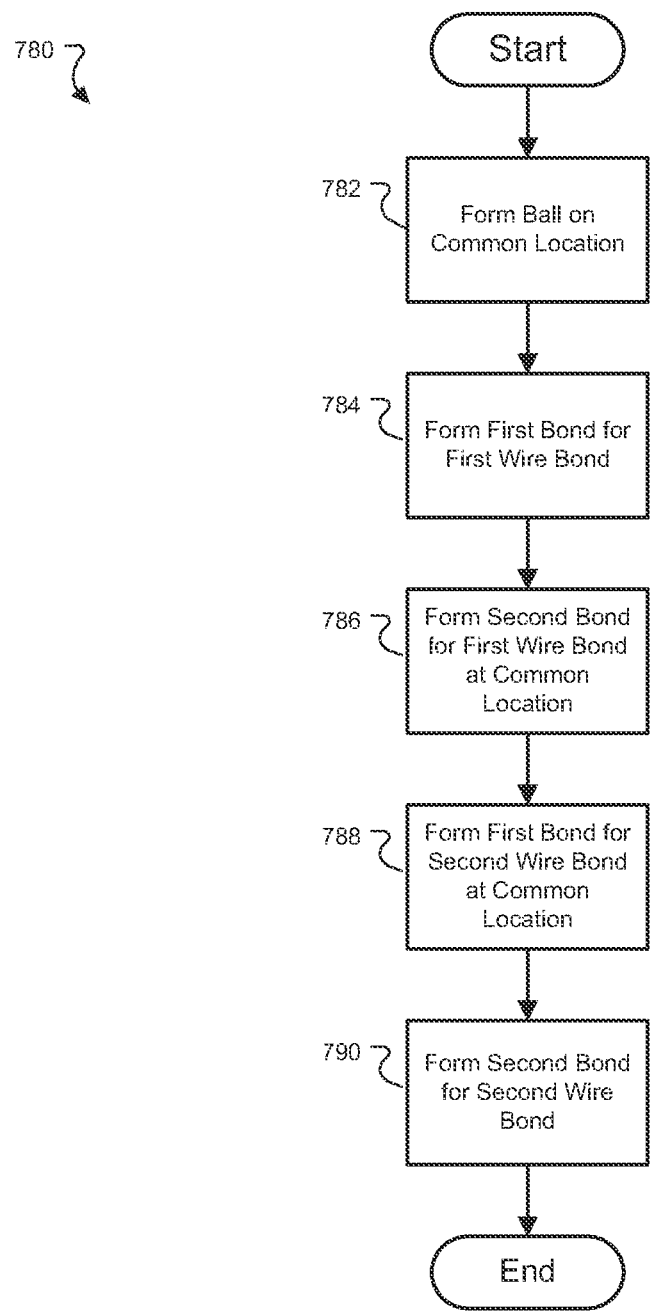
FIG. 7C shows a method for bonding two bond wires in a semiconductor package.

Referring now to FIGS. 7A and 7C, a process 780 for a two wire bonding operation includes a common location (e.g., 710) with a "first" and "second" bond or two "second" bonds (e.g., common location 760). By common location, we refer to a bond pad that includes plural bonds. By "first bond", or "first bond end" we refer to a conventional ball bond that is formed at a first location and that is used to bond a first end of the wire bond to the first location. The first location (and second location discussed below) can be a bond pad, a die pad, a bonding ring, or other location in the semiconductor package. By "second bond" or "second bond end" we refer to a conventional second bond that is used to bond a second end of a bonding wire to a location, for example a stitch bond. The process will initially be described with reference to a common location 710 that includes a "first" and "second" bond (i.e., a first end of a first bonding wire is bonded to the common location and a second end of a second bonding wire is bonded to the same common location). As a preliminary step, a ball is deposited at a common location 710 (782). Common location 710 is the location where two bond wires will be collocated. To facilitate the collocation, a first ball is formed at the common location with, for example a conventional wire bonding machine. The ball can be formed, and by operation of the wire bonding machine, no wire portion can be associated with the first ball. The wire bonding machine may break off or otherwise separate the first ball and place (or locate) the first ball at the common location, resulting in a generally ball shaped deposit at the common location with, in some implementations, a small tail (e.g., as a result of the breaking off operation). Thereafter, a bonding wire 702 that includes a first bond end 704 is bonded to a first conventional location 706 (e.g., a bond pad, a bonding ring etc.) (784). The first bond end 704 is formed in accordance with conventional means including, for example forming a ball and bonding the ball to the first conventional location 706. Thereafter, a second bond end 708 associated with bonding wire 702 is formed at the common location (e.g., a conventional die pad) 710 (786). A second bonding wire 722 that includes a first bond end 724 is bonded to the common location 708 (e.g., a bond pad) (788). The first bond end 724 is formed in accordance with conventional means including, for example forming a ball and bonding the ball at the common location. The bonding of the ball to the common location results in the placing of the ball on top of the stitch bond and ball previously placed at the common location. The resultant multi-bond and multi-ball deposit results in a slightly higher profile than a conventional single bond ball. Finally, the second bond end 728 associated with bonding wire 722 is formed at the second conventional location (e.g., a conventional die pad, bonding pad, bonding ring, etc.) 730 (790).

The process described above can be varied to include two second bonds (e.g., two second bond wire ends) at a common location. For example, with reference to FIG. 7B, a two wire bonding process that includes a common location with two "second" bonds is shown. Again as a preparatory matter, a ball is formed on the common location, here common location 760. In the example shown, a bonding wire 752 includes a first bond end 754 that is bonded to a first conventional location 756 (e.g., a bond pad, a bonding ring etc.). The first bond end 754 is formed in accordance with conventional means including, for example forming a ball and bonding the ball to the first conventional location 756. The second bond end 758 associated with bonding wire 752 is formed at the common location (e.g., a conventional die pad) 760, including bonding the first bond wire 752 to the ball that was deposited at the common location as part of the preparatory process. Thereafter, a bonding wire 772 that includes a first bond end 774 is bonded to a second conventional location 776 (e.g., a bond pad, bonding ring, die pad, etc.). The first bond end 774 is formed in accordance with conventional means including, for example forming a ball and bonding the ball at the second conventional location 776. The second bond end 778 associated with bonding wire 772 is formed at the common location (e.g., a die pad, bond pad, bonding ring, etc.) 760. The second bond end 778 is located on top of the second bond associated with bonding wire 752 and the preparatory ball at the common location 760. The processes described above can be implemented by a conventional wire bonding machine.

After die placement and wire bonding is complete, an encapsulant can be molded over each of the wire bonded dice, wire bonds, die pads and lead frame. Portions of the leads forming the lead frames can be cut off so that the remaining leadframes may be formed into, for example, a gull wing shape. The encapsulant can serve to protect the semiconductor package 100 mechanically (e.g., holding dice and wire bonds in place) and environmentally from external circuits and devices. An encapsulant may be selected from a group including plastic (e.g., molding compound), opaque plastic or epoxy resins.

To reduce the vertical height (and therefore overall size) of the semiconductor package 100, in one implementation, the encapsulant is not filled beyond the loop height formed by the wire bond disposed on the topmost die. For example, the semiconductor package 100 can be made thinner and more compact by filling the encapsulant 105 only up to the loop height of the wire bond provided on the die 154 so as to cover the wire bond sufficiently without adding excessive encapsulant to the semiconductor package 100. That is, the semiconductor package 100 need only be thick enough to accommodate the thickness of the die (or dice), die pad(s) and loop height of the wire bonds.

Figure 8B:
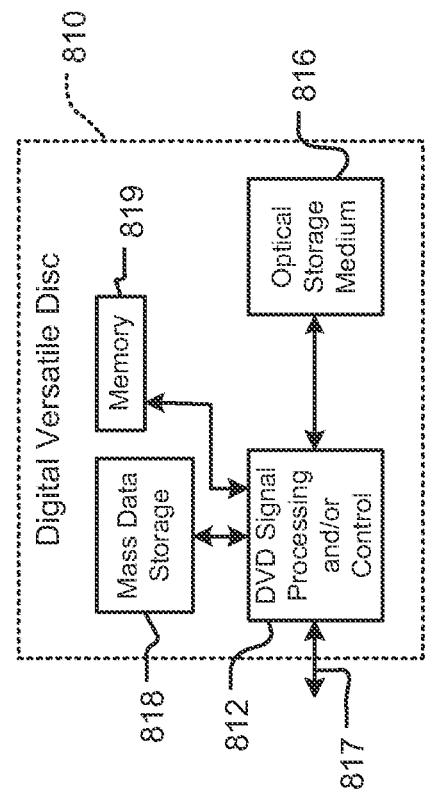
Figure 8A:
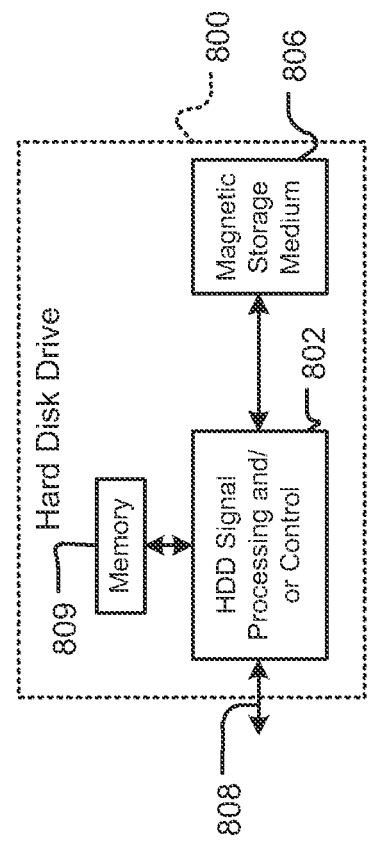

FIGS. 8A-8G show various exemplary implementations of the described systems and techniques. Referring now to FIG. 8A, the described systems and techniques can be implemented in an integrated circuit associated with a hard disk drive (HDD) 800. The described systems and techniques may be implemented in either or both signal processing and/or control circuits, which are generally identified in FIG. 8A at 802. In some implementations, the signal processing and/or control circuit 802 and/or other circuits (not shown) in the HDD 800 may process data, perform coding and/or encryption, perform calculations, and/or format data that is output to and/or received from a magnetic storage medium 806.

The HDD 800 may communicate with a host device (not shown) such as a computer, mobile computing devices such as personal digital assistants, cellular phones, media or MP3 players and the like, and/or other devices via one or more wired or wireless communication links 808. The HDD 800 may be connected to memory 809 such as random access memory (RAM), low latency nonvolatile memory such as flash memory, read only memory (ROM) and/or other suitable electronic data storage.

Referring now to FIG. 8B, the described systems and techniques can be implemented in a digital versatile disc (DVD) drive 810. The described systems and techniques may be implemented in either or both signal processing and/or control circuits, which are generally identified in FIG. 8B at 812, and/or mass data storage of the DVD drive 810. The signal processing and/or control circuit 812 and/or other circuits (not shown) in the DVD 810 may process data, perform coding and/or encryption, perform calculations, and/or format data that is read from and/or data written to an optical storage medium 816. In some implementations, the signal processing and/or control circuit 812 and/or other circuits (not shown) in the DVD 810 can also perform other functions such as encoding and/or decoding and/or any other signal processing functions associated with a DVD drive.

The DVD drive 810 may communicate with an output device (not shown) such as a computer, television or other device via one or more wired or wireless communication links 817. The DVD 810 may communicate with mass data storage 818 that stores data in a nonvolatile manner. The mass data storage 818 may include a hard disk drive (HDD). The HDD may have the configuration shown in FIG. 8A. The HDD may be a mini HDD that includes one or more platters having a diameter that is smaller than approximately 1.8". The DVD 810 may be connected to memory 819 such as RAM, ROM, low latency nonvolatile memory such as flash memory and/or other suitable electronic data storage.

Referring now to FIG. 8C, the described systems and techniques can be implemented in a high definition television (HDTV) 820. The described systems and techniques may be implemented in either or both signal processing and/or control circuits, which are generally identified in FIG. 8C at 822, a WLAN interface and/or mass data storage of the HDTV 820. The HDTV 820 receives HDTV input signals in either a wired or wireless format and generates HDTV output signals for a display 826. In some implementations, signal processing circuit and/or control circuit 822 and/or other circuits (not shown) of the HDTV 820 may process data, perform coding and/or encryption, perform calculations, format data and/or perform any other type of HDTV processing that may be required.

The HDTV 820 may communicate with mass data storage 827 that stores data in a nonvolatile manner such as optical and/or magnetic storage devices. At least one HDD may have the configuration shown in FIG. 8A and/or at least one DVD may have the configuration shown in FIG. 8B. The HDD may be a mini HDD that includes one or more platters having a diameter that is smaller than approximately 1.8". The HDTV 820 may be connected to memory 828 such as RAM, ROM, low latency nonvolatile memory such as flash memory and/or other suitable electronic data storage. The HDTV 820 also may support connections with a WLAN via a WLAN network interface 829.

Referring now to FIG. 8D, the described systems and techniques may be implemented in a control system of a vehicle 830, a WLAN interface and/or mass data storage of the vehicle control system. In some implementations, the described systems and techniques may be implemented in a powertrain control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The described systems and techniques may also be implemented in other control systems 840 of the vehicle 830. The control system 840 may likewise receive signals from input sensors 842 and/or output control signals to one or more output devices 844. In some implementations, the control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 832 may communicate with mass data storage 846 that stores data in a nonvolatile manner. The mass data storage 846 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The powertrain control system 832 may be connected to memory 847 such as RAM, ROM, low latency nonvolatile memory such as flash memory and/or other suitable electronic data storage. The powertrain control system 832 also may support connections with a WLAN via a WLAN network interface 848. The control system 840 may also include mass data storage, memory and/or a WLAN interface (all not shown).

Figure 8E:
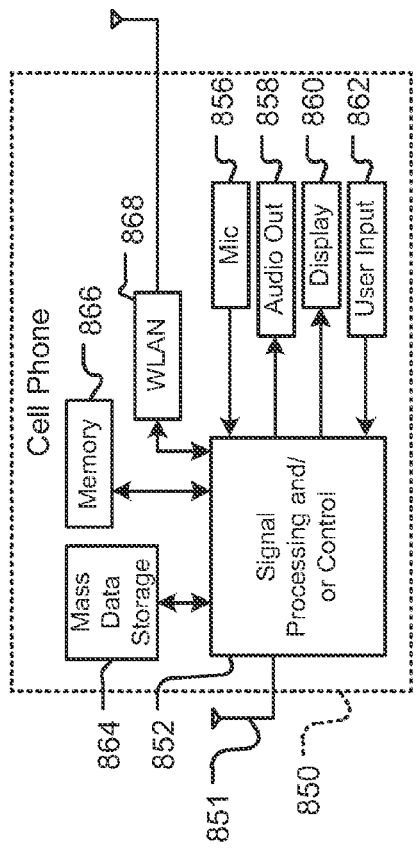

Referring now to FIG. 8E, the described systems and techniques can be implemented in a cellular phone 850 that may include a cellular antenna 851. The described systems and techniques may be implemented in either or both signal processing and/or control circuits, which are generally identified in FIG. 8E at 852, a WLAN interface and/or mass data storage of the cellular phone 850. In some implementations, the cellular phone 850 includes a microphone 856, an audio output 858 such as a speaker and/or audio output jack, a display 860 and/or an input device 862 such as a keypad, pointing device, voice actuation and/or other input device. The signal processing and/or control circuits 852 and/or other circuits (not shown) in the cellular phone 850 may process data, perform coding and/or encryption, perform calculations, format data and/or perform other cellular phone functions.

The cellular phone 850 may communicate with mass data storage 864 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The cellular phone 850 may be connected to memory 866 such as RAM, ROM, low latency nonvolatile memory such as flash memory and/or other suitable electronic data storage. The cellular phone 850 also may support connections with a WLAN via a WLAN network interface 868.

Figure 8F:
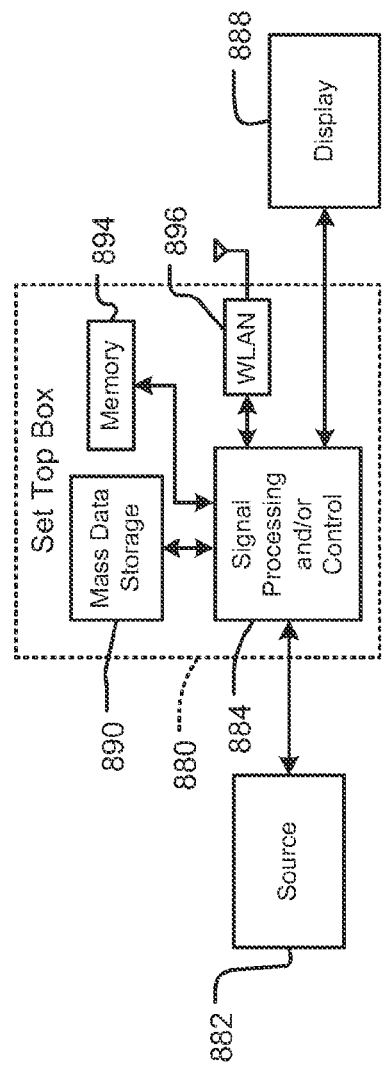

Referring now to FIG. 8F, the described systems and techniques can be implemented in a set top box 880. The described systems and techniques may be implemented in either or both signal processing and/or control circuits, which are generally identified in FIG. 8F at 884, a WLAN interface and/or mass data storage of the set top box 880. The set top box 880 receives signals from a source 882 such as a broadband source and outputs standard and/or high definition audio/video signals suitable for a display 888 such as a television and/or monitor and/or other video and/or audio output devices. The signal processing and/or control circuits 884 and/or other circuits (not shown) of the set top box 880 may process data, perform coding and/or encryption, perform calculations, format data and/or perform any other set top box function.

The set top box 880 may communicate with mass data storage 890 that stores data in a nonvolatile manner. The mass data storage 890 may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The set top box 880 may be connected to memory 894 such as RAM, ROM, low latency nonvolatile memory such as flash memory and/or other suitable electronic data storage. The set top box 880 also may support connections with a WLAN via a WLAN network interface 896.

Figure 8G:
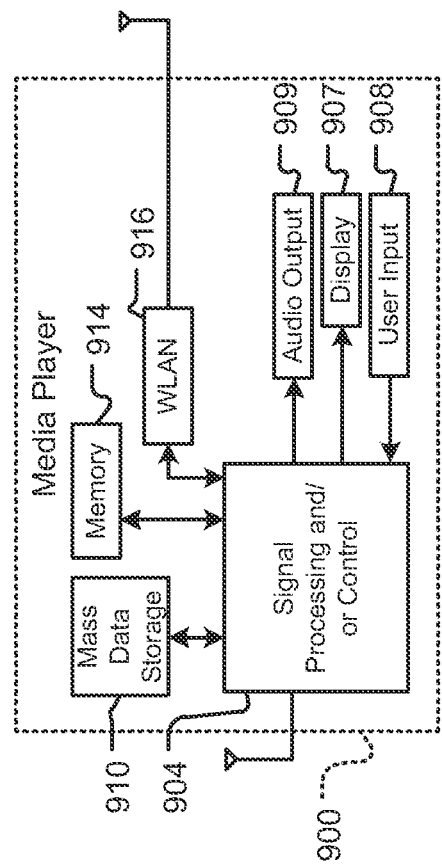

Referring now to FIG. 8G, the described systems and techniques can be implemented in a media player 900. The described systems and techniques may be implemented in either or both signal processing and/or control circuits, which are generally identified in FIG. 8G at 904, a WLAN interface and/or mass data storage of the media player 900. In some implementations, the media player 900 includes a display 907 and/or a user input 908 such as a keypad, touchpad and the like. In some implementations, the media player 900 may employ a graphical user interface (GUI) that typically employs menus, drop down menus, icons and/or a point-and-click interface via the display 907 and/or user input 908. The media player 900 further includes an audio output 909 such as a speaker and/or audio output jack. The signal processing and/or control circuits 904 and/or other circuits (not shown) of the media player 900 may process data, perform coding and/or encryption, perform calculations, format data and/or perform any other media player function.

The media player 900 may communicate with mass data storage 910 that stores data such as compressed audio and/or video content in a nonvolatile manner. In some implementations, the compressed audio files include files that are compliant with MP3 (Moving Picture experts group audio layer 3) format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. The HDD may be a mini HDD that includes one or more platters having a diameter that is smaller than approximately 1.8". The media player 900 may be connected to memory 914 such as RAM, ROM, low latency nonvolatile memory such as flash memory and/or other suitable electronic data storage. The media player 900 also may support connections with a WLAN via a WLAN network interface 916. Still other implementations in addition to those described above are contemplated.

A number of embodiments of the invention have been described. Nevertheless, it will be understood that various modifications may be made without departing from the spirit and scope of the invention. For example, the actions recited in the claims can be performed in a different order and still achieve desirable results. Accordingly, other embodiments are within the scope of the following claims.

What is claimed is:

1. A semiconductor package, comprising:
   a lead frame;
   a first die pad configured to operate at a first potential;
   a second die pad configured to operate at a second potential, wherein the second potential is different from the first potential, wherein the second die pad is situated apart from the first die pad, and wherein the second die pad is electrically isolated from the first die pad;
   a first die disposed on the first die pad;
   a second die disposed on the second die pad;
   a first wire bond connected with the first die pad and a first voltage source, which affects the first potential;
   a second wire bond connected with the second die pad and a second voltage source, which affects the second potential; and
   an encapsulant surrounding the die pads, the dice, the wire bonds, and at least a portion of the lead frame.

2. The semiconductor package of claim 1, wherein a bottom surface of the first die pad and a bottom surface of the second die pad lie in substantially a same plane.

3. The semiconductor package of claim 1, wherein a bottom surface of the first die pad and a bottom surface of the second die pad are exposed to an exterior of the semiconductor package.

4. The semiconductor package of claim 1, wherein a bottom surface of at least one of the first die pad and the second die pad is unexposed to an exterior of the semiconductor package.

5. The semiconductor package of claim 1, wherein a bottom surface of the first die pad and a bottom surface of the second die pad are substantially planar.

6. The semiconductor package of claim 1, wherein a bottom surface of the first die pad lies on a first plane and a bottom surface of the second die pad lies in a second plane different from the first.

7. The semiconductor package of claim 1, comprising:
a third die, where the third die is stacked on the first die.

8. The semiconductor package of claim 7, wherein the first die extends laterally beyond an edge of the third die.

9. The semiconductor package of claim 8, comprising:
a spacer located between the first die and the third die.

10. The semiconductor package of claim 1, wherein the first potential is ground.

11. The semiconductor package of claim 1, wherein the first voltage source comprises a bonding finger of the lead frame, wherein the first wire bond is coupled with the first die pad and the bonding finger.

12. A semiconductor package, comprising:
a lead frame;
a first wire bond;
a second wire bond;
a first voltage source to provide a first voltage;
a second voltage source to provide a second voltage;
a first die pad coupled with the first voltage source via the first wire bond;
a second die pad coupled with the second voltage source via the second wire bond;
a first die disposed on the first die pad;
a second die disposed on the second die pad; and
an encapsulant surrounding the die pads, the dice, the wire bonds, and at least a portion of the lead frame,
wherein the first die pad and the second die pad are electrically isolated from each other such that the first die pad is maintainable at a first potential associated with the first voltage source and the second die pad is maintainable at a second potential associated with the second voltage source.

13. The semiconductor package of claim 12, wherein a bottom surface of the first die pad and a bottom surface of the second die pad are exposed to an exterior of the semiconductor package.

14. The semiconductor package of claim 12, wherein the first voltage source comprises a bonding finger of the lead frame, wherein the first wire bond is coupled with the first die pad and the bonding finger.

* * * * *